United States Patent
Deng et al.

(10) Patent No.: US 9,412,437 B2
(45) Date of Patent: Aug. 9, 2016

(54) SRAM WITH BUFFERED-READ BIT CELLS AND ITS TESTING

(71) Applicant: Texas Instruments Incorporated, Dallas, TX (US)

(72) Inventors: Xiaowei Deng, Plano, TX (US); Wah Kit Loh, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/151,313

(22) Filed: Jan. 9, 2014

(65) Prior Publication Data

US 2014/0126277 A1    May 8, 2014

Related U.S. Application Data

(62) Division of application No. 14/010,881, filed on Aug. 27, 2013, now abandoned, which is a division of application No. 13/135,198, filed on Jun. 27, 2011.

(60) Provisional application No. 61/365,157, filed on Jul. 16, 2010.

(51) Int. Cl.
  *G11C 11/419*  (2006.01)
  *G11C 8/16*    (2006.01)
  *G11C 29/02*   (2006.01)
  *G11C 11/41*   (2006.01)

(52) U.S. Cl.
  CPC .......... *G11C 11/419* (2013.01); *G11C 8/16* (2013.01); *G11C 29/022* (2013.01); *G11C 11/41* (2013.01)

(58) Field of Classification Search
  USPC ........... 365/154, 190, 189.05, 230.05, 230.06
  See application file for complete search history.

(56) References Cited

U.S. PATENT DOCUMENTS

| | | | | |
|---|---|---|---|---|
| 4,802,122 A | * | 1/1989 | Auvinen | G06F 5/10 365/154 |
| 6,473,357 B1 | * | 10/2002 | Fan et al. | 365/230.05 |
| 6,501,692 B1 | | 12/2002 | Melanson et al. | |
| 6,958,948 B2 | * | 10/2005 | Shiraishi | 365/230.05 |
| 7,411,409 B2 | * | 8/2008 | Klass et al. | 324/750.3 |
| 7,414,903 B2 | | 8/2008 | Noda | |
| 7,613,032 B2 | * | 11/2009 | Yabe | 365/154 |
| 7,630,273 B2 | * | 12/2009 | Suzuki | 365/230.05 |

(Continued)

FOREIGN PATENT DOCUMENTS

EP         0288860   *   4/1988

OTHER PUBLICATIONS

Chang et al., "Stable SRAM Cell Design for the 32 nm Node and Beyond," 2005 Symposium on VLSI Technology, 8A-2, 128 (2005).

(Continued)

*Primary Examiner* — Kretelia Graham
(74) *Attorney, Agent, or Firm* — Rose Alyssa Keagy; Frank D. Cimino (57) ABSTRACT

An SRAM with buffered-read bit cells is disclosed (FIGS. 1-6). The integrated circuit includes a plurality of memory cells (102). Each memory cell has a plurality of transistors (200, 202). A first memory cell (FIG. 2) is arranged to store a data signal in response to an active write word line (WWL) and to produce the data signal in response to an active read word line (RWL). A test circuit (104) formed on the integrated circuit is operable to test current and voltage characteristics of each transistor of the plurality of transistors of the first memory cell (FIGS. 7-10).

7 Claims, 7 Drawing Sheets

(56) References Cited

U.S. PATENT DOCUMENTS

| | | | |
|---|---|---|---|
| 7,719,880 B2* | 5/2010 | Nakazato | 365/156 |
| 7,746,709 B2* | 6/2010 | Joshi et al. | 365/189.05 |
| 7,839,697 B2* | 11/2010 | Ishikura et al. | 365/189.04 |
| 7,986,566 B2* | 7/2011 | Houston | 365/189.05 |
| 8,203,867 B2 | 6/2012 | Houston | |
| 8,437,213 B2 | 5/2013 | Deng et al. | |
| 2002/0003743 A1* | 1/2002 | Kunikiyo | 365/230.05 |
| 2009/0059653 A1* | 3/2009 | Luk et al. | 365/149 |
| 2009/0303776 A1* | 12/2009 | Mair | 365/154 |
| 2010/0091585 A1* | 4/2010 | Wang | G11C 11/413 365/189.011 |
| 2011/0110166 A1* | 5/2011 | Miyanishi | 365/189.05 |

OTHER PUBLICATIONS

Deng et al., "Characterization of Bit Transistors in a Functional SRAM," 2008 Symposium on VLSI Technology, 44 (2008).

Deng et al., "Measurement of Bit Leakages in a Functional SRAM," 2009 Proceedings from the 35th ISTFA, 16 (Nov. 2009).

* cited by examiner

|   | WL En | VDDWL | VDDA | Din | Qout | COMMENT |
|---|---|---|---|---|---|---|
| A) BUFFER Iread | RWL | 1.2 V | 1.2 V | 1.2 V | 1.2 V | INITIALIZE SNT = 0 |
| B) BUFFER DR | BOTH | 1.6 V | =Qout | Vd | Vg | MEASURE Id FROM Din |
| C) BUFFER PG | RWL | Vg | 1.6 V | Vd | DON'T CARE | INITIALIZE SNT = 0; MEASURE Id FROM Din |
| D) BUFFER LEAKAGE | RWL | 1.2 V | 1.2 V | 0.6 V | DON'T CARE | INITIALIZE SNT = 1; MEASURE I FROM Din |
| E) BUFFER OPEN | RWL | 1.4 V | 1.4 V | 0.2 V | DON'T CARE | INITIALIZE SNT = 0; MEASURE I FROM Din |

*FIG. 8*

|   | WDDWL | VDDA | VSSA | Din | Qout | COMMENT |
|---|---|---|---|---|---|---|
| A) T5 READ | Vg | 1.6 V | 0.0 V | Vd | 1.6 V | MEASURE Id FROM Din |
| B) T5 WRITE | Vg | 1.6 V | Vd | 0.0 V | 1.6 V | MEASURE Is FROM Din |
| C) T1 FORWARD | 1.6 V | Vg | 0.0 V | Vd | Vg | MEASURE Id FROM Din |
| D) T1 REVERSE | 1.6 V | Vg | Vd | 0.0 V | Vg | MEASURE Is FROM Din |
| E) T3 FORWARD | 1.6 V | Vs | 0.0 V | Vd | 0.0 V | MEASURE Id FROM Din |
| F) T3 REVERSE | 1.6 V | 0.0 V | Vs | Vs | Vg | MEASURE Is FROM Din |

SRAM WITH BUFFERED-READ BIT CELLS AND ITS TESTING

CLAIM TO PRIORITY OF NONPROVISIONAL APPLICATION

This application is a divisional of U.S. application Ser. No. 14/010,881 filed Aug. 27, 2013, which is a divisional of U.S. application Ser. No. 13/135,198 filed Jun. 27, 2011, which claims the benefit under 35 U.S.C. §119(e) of Provisional Appl. No. 61/365,157, filed Jul. 16, 2010, the contents which are incorporated herein by reference.

BACKGROUND OF THE INVENTION

Embodiments of the present invention relate to a static random access memory (SRAM), particularly an SRAM with buffered-read bit cells and its testing.

Shrinking semiconductor integrated circuit feature sizes have placed increasing challenges on semiconductor integrated circuit processing. In particular, a balance between high packing density and yield requires a finely tuned manufacturing process. Minimum feature sizes of high density memory cells are frequently less than corresponding feature sizes of peripheral circuits. As a result, subtle defects at these minimum feature sizes can adversely impact product yield. Physical failure analysis (PFA) has often been used to determine the precise cause of these subtle defects. However, PFA is time consuming, destructive, and may not reveal all defects such as gate dielectric failure. Additional complexity of current memory cells such as the 8T SRAM memory cell disclosed by Chang et al., "Stable SRAM Cell Design for the 32 nm Node and Beyond," 2005 Symposium on VLSI Technology, 8A-2, 128 (2005), further complicate PFA. Moreover, the 8T SRAM cell of Chang et al. further complicates characterization of individual memory cells in a functional memory circuit. Thus, there is a need to more accurately diagnose memory circuit defects without the time, expense, and complication of PFA.

BRIEF SUMMARY OF THE INVENTION

In a preferred embodiment of the present invention, an integrated circuit is formed having a plurality of memory cells. Each memory cell has a plurality of transistors. A first memory cell is arranged to store a data signal in response to an active write word line and to produce the data signal in response to an active read word line. The integrated circuit further includes a test circuit operable to test current and voltage characteristics of each transistor of the plurality of transistors of the first memory cell.

DETAILED DESCRIPTION OF THE INVENTION

The preferred embodiments of the present invention provide significant advantages in electrical failure analysis and characterization of individual buffered-read memory cells or individual transistors of buffered-read memory cells of a functional static random access memory (SRAM) using functional test or direct bit line access (DBLA).

The present inventors have previously disclosed a circuit and method to characterize individual transistors of a 6-transistor (6T) SRAM memory cell by direct bit line access in application Ser. No. 12/347,928, filed Dec. 31, 2008, and incorporated herein by reference in its entirety. Additional disclosures by the present inventors regarding characterization of individual transistors of a 6T SRAM memory cell are also presented at Deng et al., "Characterization of Bit Transistors in a Functional SRAM," 2008 Symposium on VLSI Technology, 44 (2008) and Deng et al., "Measurement of Bit Leakages in a Functional SRAM," 2009 Proceedings from the 35th ISTFA, 16 (November 2009), both of which are incorporated herein by reference in their entirety. The present invention is directed to a circuit and method for testing and characterization of individual buffered-read bit cells and individual transistors of buffered-read bit cells in a functional SRAM. The following embodiments of the present invention are presented by way of example. Numerous alternative designs that fall within the scope of the present claimed invention will be obvious to one of ordinary skill in the art having access to the instant specification.

Figure 1:
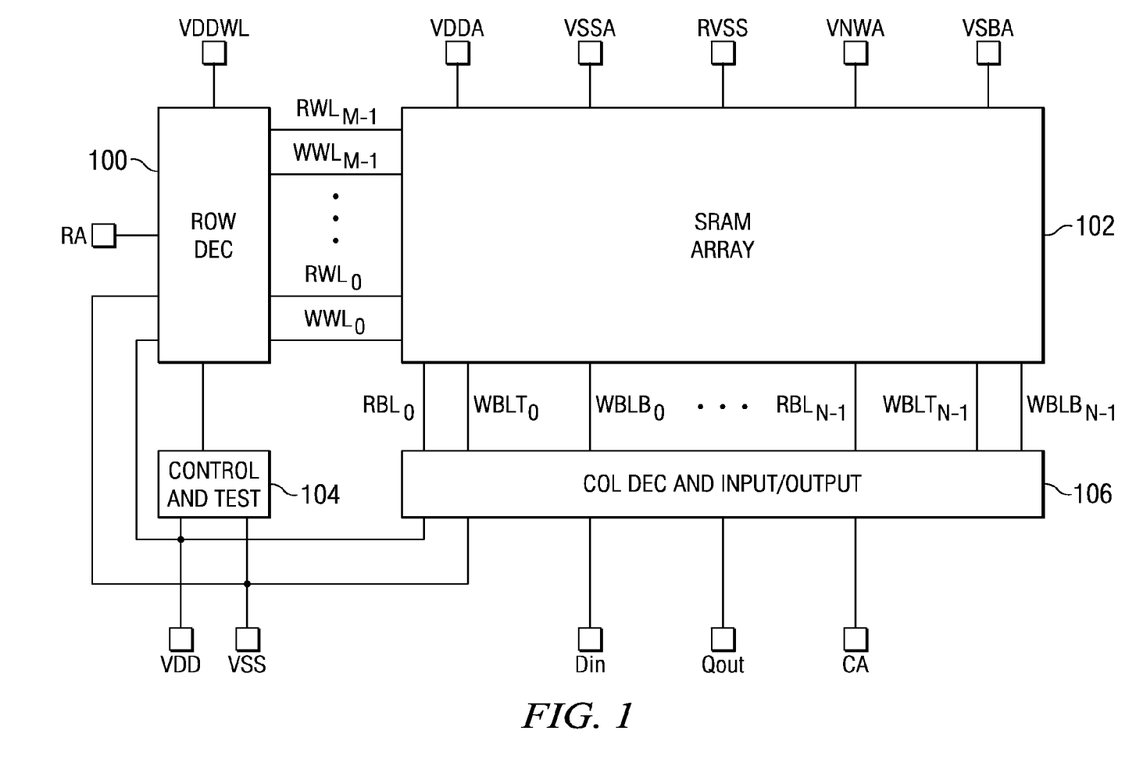
FIG. 1 is a block diagram of a static random access memory (SRAM) of the present invention.

Referring now to FIG. 1, there is a block diagram of a static random access memory (SRAM) of the present invention. The SRAM of FIG. 1 may be a stand alone integrated circuit memory or it may be embedded in a larger integrated circuit having, for example, a processor, nonvolatile memory, or analog circuits. The SRAM includes row periphery circuitry or row decode circuit 100, column periphery circuitry or column decode and input/output (I/O) circuit 106, SRAM memory array 102, and control and test circuit 104. The memory array 102 includes an array of memory cells in rows and columns. Each row of the memory cells shares a write word line WWLx and a read word line RWLx from the row periphery circuitry, where x is an integer from 0 to M−1. Each column of the memory cells shares a pair of write bit lines WBLTy/WBLBy and a read bit line RBLy from the column periphery circuitry, where y is an integer from 0 to N−1. The row periphery circuitry 100 typically includes row address decode and word line driver circuits and is operable to activate a read word line or a write word line during a read or write operation. The column periphery circuitry typically includes write, bit line precharge, column multiplexer, sense amplifier, and I/O circuits. It is operable to drive a data signal onto a pair of write bit lines during a write operation and to sense and amplify a data signal from a bit cell on a read bit line during a read operation. The small square terminals signify bond pads or ports for receiving external voltages and signals to operate the SRAM. For example, row decode circuit 100, control and test circuit 104 and column decode and I/O circuit 106 are coupled to receive power supply voltage VDD and reference voltage VSS. Row decode circuit 100 also receives word line supply voltage VDDWL and row address signals RA. Column decode and I/O circuit 106 receives data input signals Din, and produces data output signals Qout in response to received column address signals CA. SRAM array 102 receives array voltage VDDA and array reference voltage VSSA. SRAM array 102 also receives read buffer reference voltage RVSS as will be explained in detail. Voltage supplies VNWA and VSBA are coupled to N-well regions and P-well regions, respectively, of the SRAM array 102.

Figure 2:
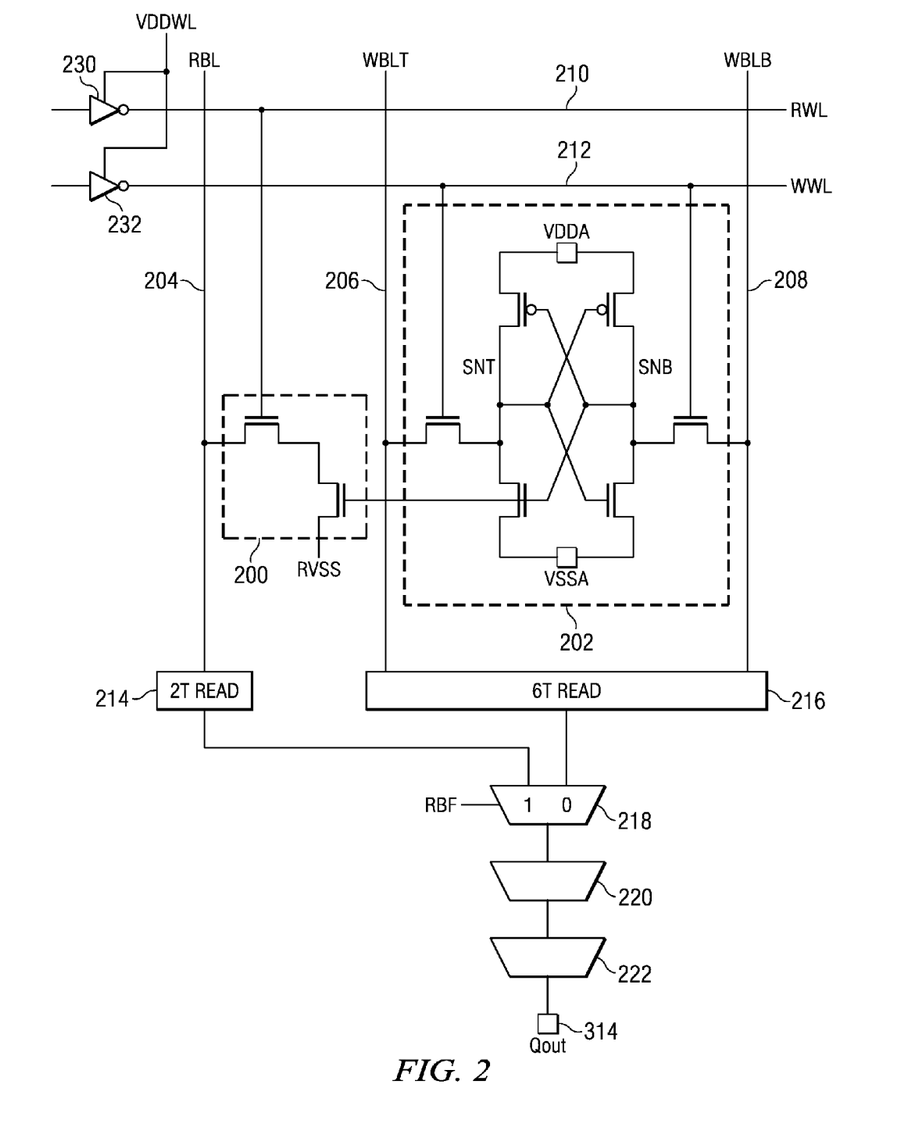
FIG. 2 is a high level schematic diagram of an 8T memory cell with associated input/output (I/O) functional mode circuitry that may be used in the SRAM of FIG. 1.

Referring now to FIG. 2, there is a high level schematic diagram of an 8T memory cell with associated input/output (I/O) functional mode circuitry that may be used in the SRAM of FIG. 1. Here and in the following discussion, functional operation or functional memory refers to an operational SRAM memory where data is written into each memory cell through digital write circuitry and read out from each memory cell by amplifying data signals on bit lines to digital levels through differential or single-ended sense amplifiers. This is in contrast to simpler test structures. The memory cell includes a 6-transistor (6T) latch portion 202 and a 2-transistor (2T) buffer portion 200. The 6T latch portion is connected between write bit line true (WBLT) 206 and complementary write bit line bar (WBLB) 208. Gates of N-channel access transistors are connected to write word line (WWL) 212. The 2T buffer includes an N-channel access transistor having a gate connected to read word line (RWL) 210 and a driver or sense N-channel transistor having a gate connected to a storage node SNB of the 6T latch portion. RWL 210 and WWL 212 are driven by inverters 230 and 232, respectively, and powered by VDDWL. The associated I/O circuitry includes 2T read amplifier 214 and 6T amplifier 216. An output signal on RBL is amplified by the 2T read amplifier 214. Correspondingly, an output signal from the latch portion 202 on WBLT and WBLB is amplified by the 6T amplifier 216. Output signals from 2T read amplifier 214 and 6T amplifier 216 are applied to multiplex circuit 218. Multiplex circuit 218 is coupled to receive mode signal (RBF). When RBF is high, mulitplex circuit 218 applies the output signal from the 2T read amplifier to multiplexers 220, 222, and output terminal Qout 314. Alternatively, when RBF is low, mulitplex circuit 218 applies the output signal from the 6T amplifier to multiplexers 220, 222, and output terminal Qout 314. Of course the number of multiplex circuits may vary depending on the organization of the memory circuit. Also, blocks 214 and 216 may each have one or more levels of column multiplexers.

Independently reading from the 2T buffer and the 6T latch portion is highly advantageous. If a read error occurs when reading only from the 2T buffer, there is no indication whether the 6T latch portion or the 2T buffer caused the error. Moreover, there is no indication that the latch portion was even written correctly. The ability to bypass the 2T buffer and read directly from the 6T latch portion indicates whether the latch portion correctly received and stored a data signal. Furthermore, if the latch portion does yield the correct data signal, then the 2T buffer is the likely cause of any read error.

Figure 3:
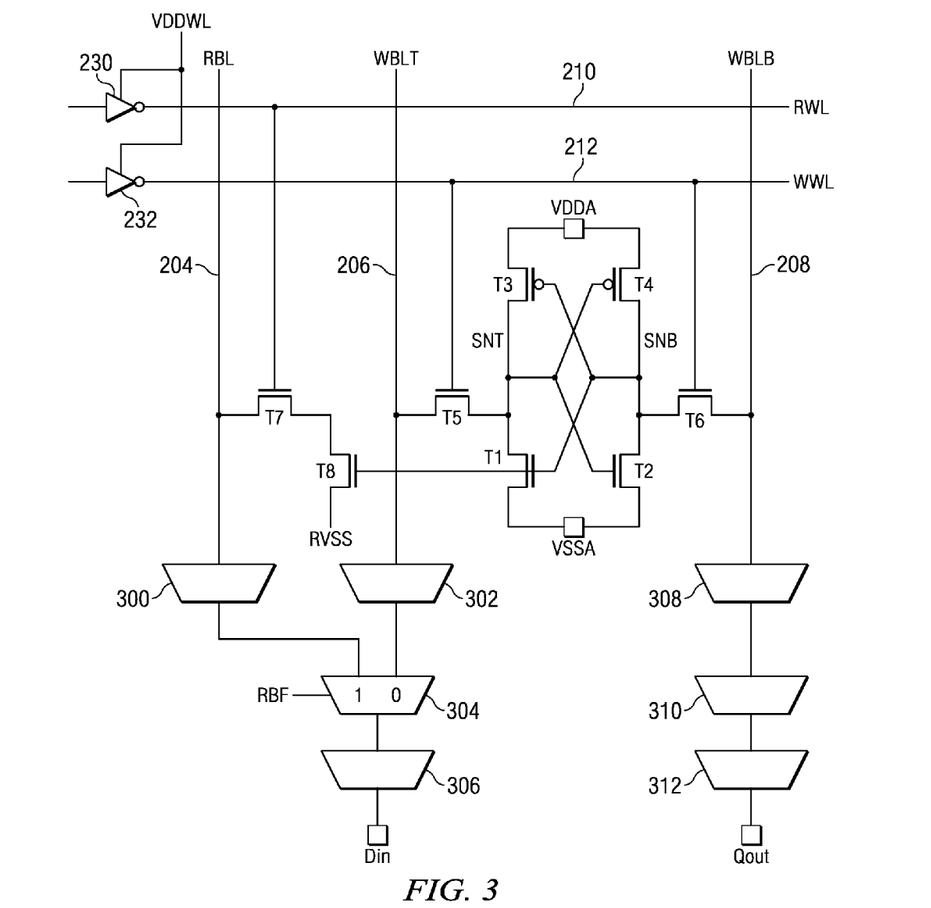
FIG. 3 is a high level schematic diagram of an 8T memory cell with associated input/output (I/O) direct bit line access (DBLA) circuitry that may be used in the SRAM of FIG. 1.

Turning now to FIG. 3, there is a high level schematic diagram of an 8T memory cell with associated input/output (I/O) direct bit line access (DBLA) circuitry that may be used in the SRAM of FIG. 1. Here and in the following discussion, the same reference numerals are used to identify the same circuit elements. The 8T memory cell is the same as previously described with respect to FIG. 2. The 6T latch portion includes transistors T1 through T6. The 2T buffer portion includes access or pass gate transistor T7 and driver transistor T8. The I/O circuit also includes analog multiplexers 300 through 312. These analog multiplexers are bidirectional and conduct a range of analog voltages and currents during transistor characterization as will be described in detail. They are typically formed by a P-channel transistor and an N-channel transistor having parallel current paths as is well known in the art. Other analog multiplex circuits as well known in the art may also be used. As previously discussed, the number of multiplexers may vary according to the organization of the memory circuit. Also, blocks 300, 302, and 308 may each have one or more levels of column multiplexers.

Multiplex circuit 304 is coupled to receive mode signal (RBF). When RBF is high, mulitplex circuit 304 couples data input pad Din to RBL. This applies the analog voltage at external terminal Din to RBL. When RBF is low, and mulitplex circuit 304 couples data input terminal Din to WBLT. Multiplex circuits 308 through 312 couple external terminal Qout to WBLB. In each case, the multiplex circuits are designed to be much more conductive than the memory cell transistors so that their on resistance is negligible.

Figure 4:
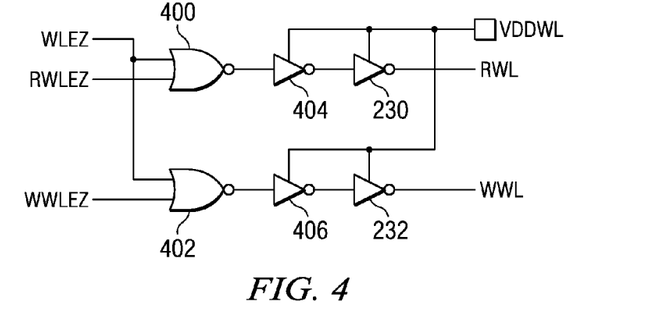
FIG. 4 is a schematic diagram of an embodiment of word line driver circuitry that may be used in the SRAM of FIG. 1.

Referring now to FIG. 4, there is a schematic diagram of an embodiment of word line driver circuitry that may be used in the SRAM of FIG. 1. Here and in the following discussion, a "Z" suffix on a signal name indicates an active low signal. For example, word line enable (WLEZ) enables NOR gates 400 and 402 when low. In a similar manner read word line enable (RWLEZ) produces a high level output from enabled NOR gate 400 when low. Likewise, write word line enable (WWLEZ) produces a high level output from enabled NOR gate 402 when low. A high level from NOR gate 400 is buffered by inverters 404 and 230 to produce a read word line (RWL) signal at the VDDWL level. A high level from NOR gate 402 is buffered by inverters 406 and 232 to produce a write word line (WWL) signal at the VDDWL level. An advantage of this word line driver circuitry is that both RWLEZ and WWLEZ may be low at the same time in a test mode to simultaneously produce high levels of RWL and WWL as will be discussed in detail.

Two other points regarding the word line driver circuitry of FIG. 4 are worthy of mention. First, when a high voltage level greater than nominal VDD is required for either RWL or WWL, VDD must be increased together with VDDWL to prevent simultaneously turning on P-channel and N-channel transistors of inverters 230 or 232. Second, when VDDWL is used as a gate voltage to characterize N-channel transistors, the low voltage output level from inverters 230 and 232 is limited to about 0.2 V with P-channel transistors of each inverter operating in a sub threshold region. This is typically below the threshold voltage of the N-channel transistors and is, therefore, adequate. If a lower output voltage is necessary, one may add N-channel transistors between VDDWL and RWL and between VDDWL and WWL with their gates driven by the outputs of NOR gates 400 and 402, respectively.

Figure 5:
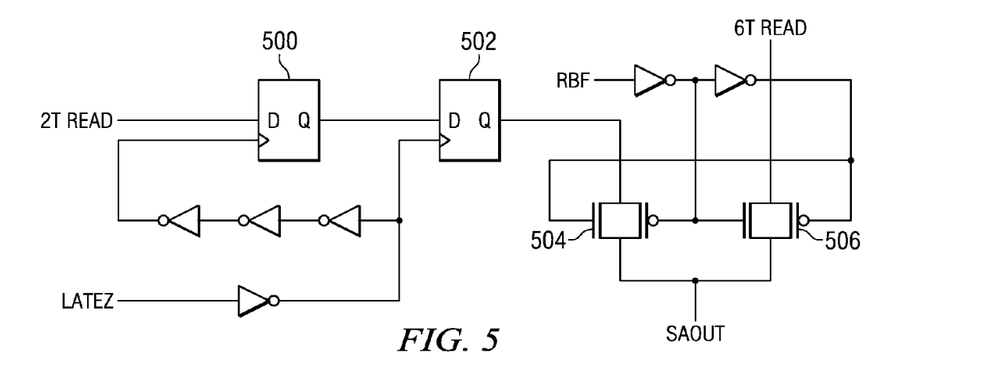
FIG. 5 is a schematic diagram of an embodiment of column data selection circuitry for functional operation of the SRAM memory of FIG. 1.

Turning now to FIG. 5, there is a schematic diagram of an embodiment of column data selection circuitry for functional operation of the SRAM memory of FIG. 1. The 2T read signal is from read amplifier 214 and the 6T read signal is from amplifier 216. (FIG. 2). Series connected delay latches 500 and 502 form a master-slave flip flop to latch the read data and apply it to CMOS pass gate 504 in response to latch control signal LATEZ. The 6T read signal is applied directly to CMOS pass gate 506. Taken together, CMOS pass gates 504 and 506 and associated inverters form multiplex circuit 218 of FIG. 2. When mode signal RBF is low, CMOS pass gate 504 is off and CMOS pass gate 506 produces the 6T read signal as SAOUT. Correspondingly, when mode signal RBF is high, CMOS pass gate 506 is off and CMOS pass gate 504 produces the 2T read signal as SAOUT. As previously discussed, this arrangement is highly advantageous in determining the cause of any read errors that may occur in a functional SRAM without the time and expense of physical failure analysis.

Figure 6:
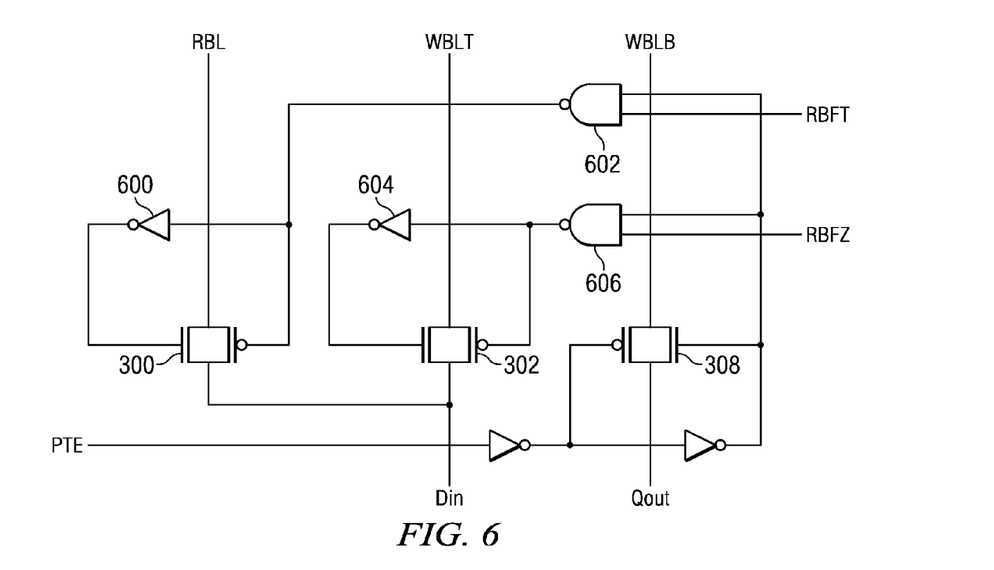
FIG. 6 is a schematic diagram of an embodiment of column data selection circuitry for direct bit line access (DBLA) operation of the SRAM memory of FIG. 1.

Referring to FIG. 6, there is a schematic diagram of an embodiment of column data selection circuitry for direct bit line access (DBLA) operation of the SRAM memory of FIG. 1. CMOS pass gates 300 and 302 form the analog multiplexer 304 of FIG. 3. Parametric test enable signal (PTE) controls operation of the circuit and is high in a DBLA test mode. Complementary mode control signals RBFT and RBFZ enable either CMOS pass gate 300 or CMOS pass gate 302 when PTE is high. For example, when PTE is high CMOS pass gate 308 is on and connects external terminal Qout to WBLB. The high level of PTE enables NAND gates 602 and 606. When RBFT is low and RBFZ is high, CMOS pass gate 300 is off. The high level of RBFZ produces a low level output from NAND gate 606 and a high level output from inverter 604 to turn on CMOS pass gate 302. Thus, external terminal Din is connected to WBLT. Alternatively, when RBFT is high and RBFZ is low, CMOS pass gate 302 is off. The high level of RBFT produces a low level output from NAND gate 602 and a high level output from inverter 600 to turn on CMOS pass gate 300. Thus, external terminal Din is connected to RBL. Of course, the number of such analog multiplex circuits may vary according to the organization and size of the SRAM memory. These analog multiplex circuits are highly advantageous in providing direct bit line access (DBLA) between external terminals and internal read and write bit lines. This permits application of analog voltage levels to individual transistors of each memory cell for characterization and parametric testing as will be discussed in detail. Moreover, such characterization reveals the cause of memory cell failures and marginal operation without the time and expense of physical failure analysis.

Referring now to FIGS. 7A through 7E, there are simplified schematic diagrams showing various tests that may be performed on a 2-transistor (2T) buffer portion of an 8T memory cell using DBLA of the present invention. These tests allow the measurements of the current-voltage characteristics, threshold voltage, leakage, and conductivity of each transistor in the 2T buffer portion as will be described in detail. Operation of these tests will be explained with reference to corresponding rows A through E of FIG. 8. For the purpose of illustration, 1.2 V is a nominal voltage and 1.6 V is a high voltage for operation of the SRAM memory. In the following discussion, positive current flow is illustrated in the direction of the arrows of FIGS. 7A through 7E. Current flow may also be measured in the opposite direction by polarity reversal of drain and source voltages as will be apparent to one of ordinary skill in the art having access to the instant specification.

Figure 7A:
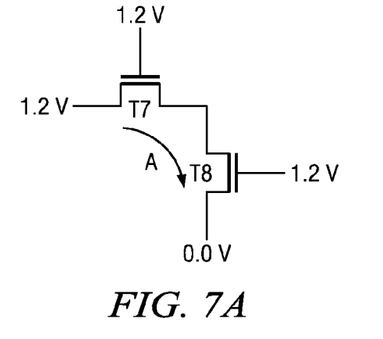
FIGS. 7A-7E are simplified schematic diagrams showing various tests that may be performed on a 2-transistor (2T) buffer portion of an 8T memory cell using DBLA of the present invention.
Figure 8:
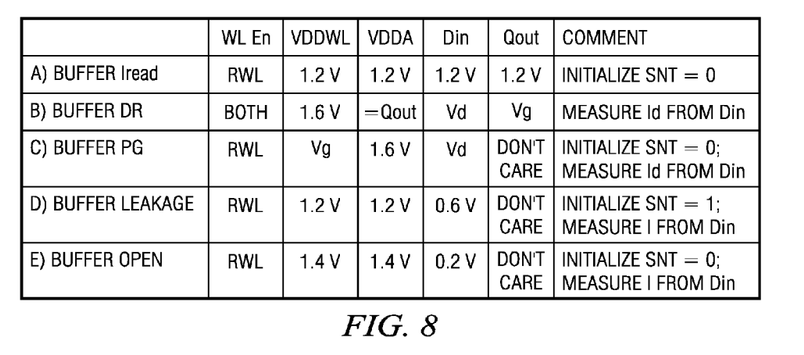
FIG. 8 is a table showing test conditions corresponding to FIGS. 7A-7E.
Figure 9A:
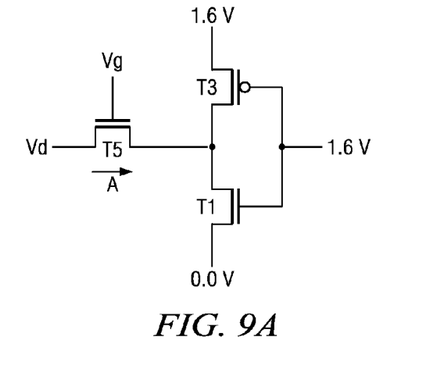
FIGS. 9A-9F are simplified schematic diagrams showing various tests that may be performed on a 6-transistor (6T) latch portion of an 8T memory cell using DBLA of the present invention.
Figure 9B:
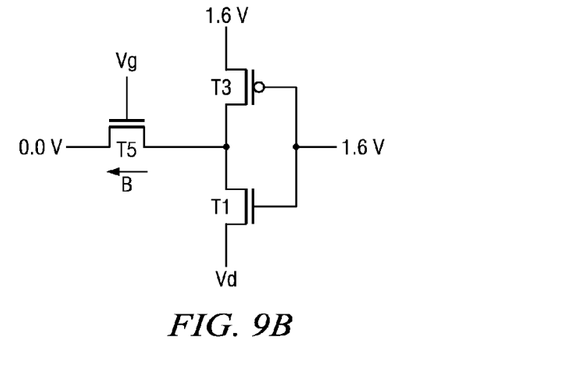
Figure 9C:
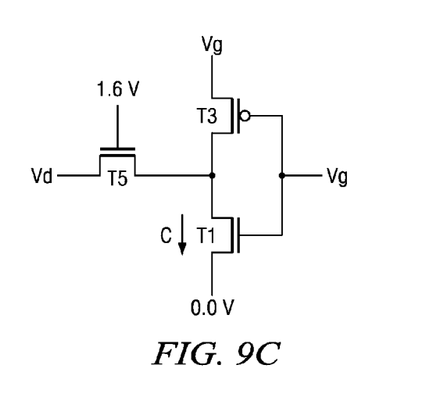
Figure 9D:
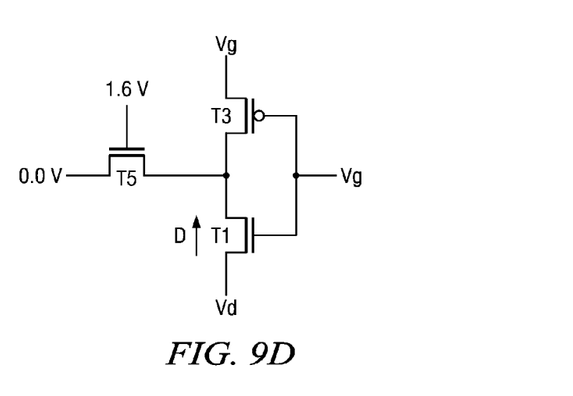
Figure 9E:
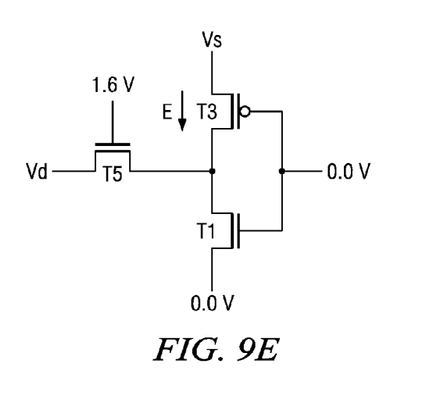
Figure 9F:
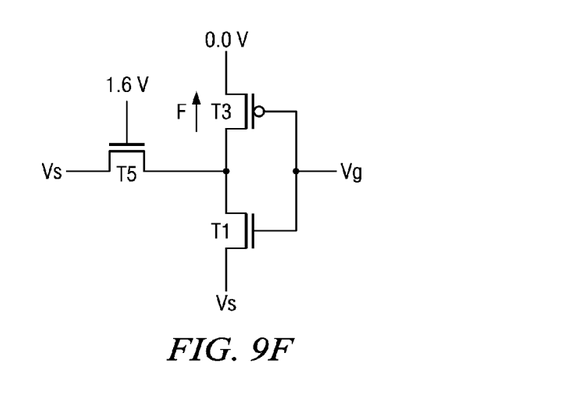

FIG. 7A and row A of FIG. 8 illustrate conditions for read current (Iread) measurement of the 2T buffer of a selected memory cell. Here, read current refers to the ability of series transistors T7 and T8 to sink current in a read operation. First the true storage node SNT of the memory cell (FIG. 3) is initialized to logic 0 and the complementary storage node SNB is initialized to logic 1. VDDA is set to 1.2 V. This places 1.2 V on the gate of transistor T8. RWL is enabled with VDDWL at 1.2 V to place 1.2 V on the gate of transistor T7. External terminal Din receives 1.2 V and read current A (FIG. 7A) is measured into the memory from Din.

Figure 7B:
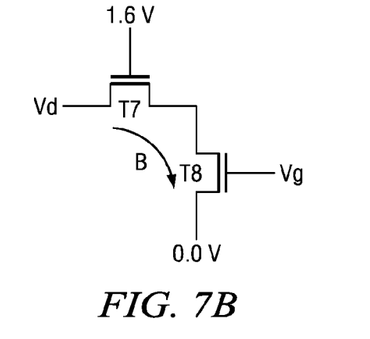

FIG. 7B and row B of FIG. 8 illustrate conditions for driver transistor current-voltage measurement of the 2T buffer of a selected memory cell. Here, drive current refers to the current transistor T8 is able to sink for a range of drain and gate voltages. Both RWL and WWL are enabled with 1.6 V on VDDWL. This high voltage makes transistor T7 much more conductive than transistor T8 so that measured current is due to T8. VDDA is set to the same value as Qout. A range of drain voltages for T8 is applied to external terminal Din and a range of gate voltages for T8 is applied to external terminal Qout. At each set of voltages drive current B (FIG. 7B) is measured into the memory from Din.

Figure 7C:
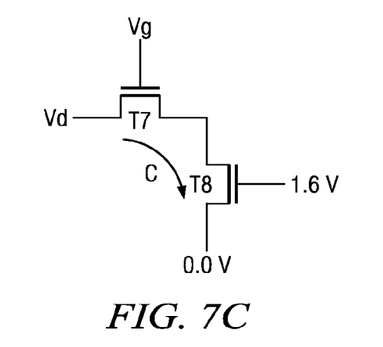

FIG. 7C and row C of FIG. 8 illustrate conditions for pass gate transistor current-voltage measurement of the 2T buffer of a selected memory cell. Here, pass gate current refers to the current transistor T7 is able to pass for a range of drain and gate voltages. RWL is enabled and a range of gate voltages for T7 is applied to RWL via VDDWL. Array voltage VDDA is set to 1.6 V. This high voltage makes transistor T8 much more conductive than transistor T7 so that measured current is due to T7. A range of drain voltages for T7 is applied to external terminal Din. At each set of voltages pass gate current C (FIG. 7C) is measured into the memory from Din.

Figure 7D:
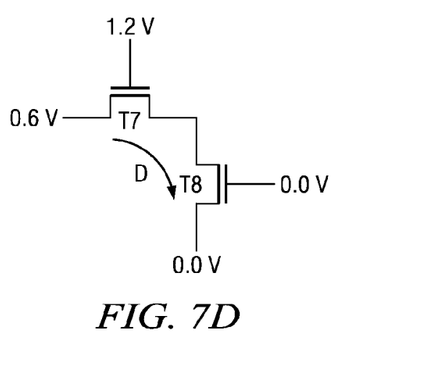

FIG. 7D and row D of FIG. 8 illustrate conditions for buffer leakage measurement of the 2T buffer of a selected memory cell. Here, buffer leakage current is the leakage current through transistor T8 when it is off and transistor T7 is on. First the true storage node SNT of the memory cell (FIG. 3) is initialized to logic 1 and the complementary storage node SNB is initialized to logic 0. VDDA is set to 1.2 V. This places 0.0 V on the gate of transistor T8. RWL is enabled with VDDWL at 1.2 V to place 1.2 V on the gate of transistor T7. External terminal Din receives 0.6 V and leakage current D (FIG. 7D) is measured into the memory from Din.

Figure 7E:
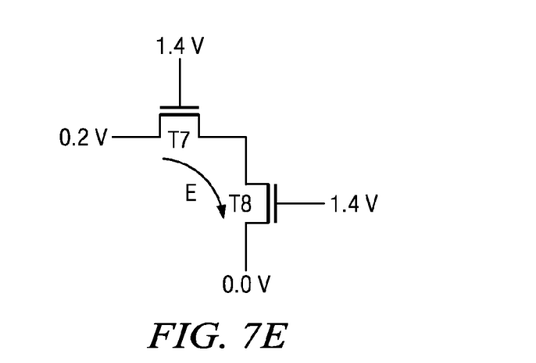

FIG. 7E and row E of FIG. 8 illustrate conditions for an open circuit test of the 2T buffer of a selected memory cell. This is to test whether the 2T buffer is open when both T7 and T8 are strongly turned on. First the true storage node SNT of the memory cell (FIG. 3) is initialized to logic 0 and the complementary storage node SNB is initialized to logic 1. VDDA is set to 1.4 V. This places 1.4 V on the gate of transistor T8. RWL is enabled with VDDWL at 1.4 V to place 1.4 V on the gate of transistor T7. External terminal Din receives 0.2 V and current E (FIG. 7E) is measured into the memory from Din.

Figure 10:
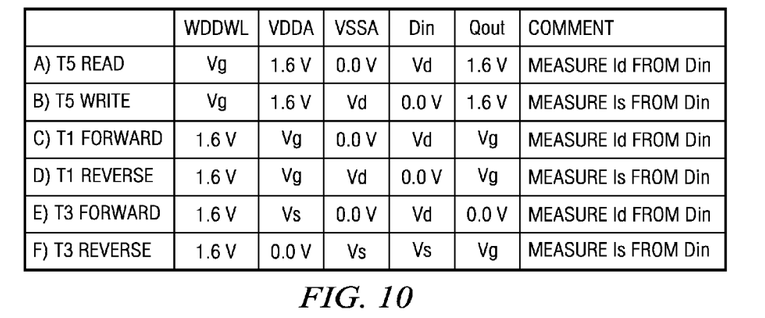
FIG. 10 is a table showing test conditions corresponding to FIGS. 9A-9F.

Referring next to FIGS. 9A through 9F, there are simplified schematic diagrams showing various tests that may be performed on a 6-transistor (6T) latch portion of an 8T memory cell using DBLA of the present invention. These tests allow the measurements of the current-voltage characteristics, threshold voltage, leakage, and conductivity of each transistor in the 6T latch portion as will be described in detail. Operation of these tests will be explained with reference to corresponding rows A through F of FIG. 10. For the purpose of illustration, 1.2 V is a nominal voltage and 1.6 V is a high voltage for operation of the SRAM memory. In the following discussion, positive current flow is illustrated in the direction of the arrows of FIGS. 9A through 9F. Characterization of individual transistors of the left half of the 6T memory cell is explained in the following discussion. By symmetry, characterization of individual transistors of the right half of the 6T memory cell is performed in a similar manner with appropriate voltages applied to external terminals.

To characterize transistor T5 in a read direction VDD, VNWA, VDDA and external terminal Qout are held at 1.6 V. Thus, the gate of transistor T1 is at 1.6 V. This high voltage makes transistor T1 much more conductive than transistor T5 so that measured current is due to T5. VSS, VSBA, and VSSA are set to 0.0 V. A range of drain voltages for T5 is applied to external terminal Din and a range of gate voltages for T5 is applied to VDDWL. At each set of voltages current A (FIG. 9A) is measured into the memory from Din.

To characterize transistor T5 in a write direction VDD, VNWA, VDDA and external terminal Qout are again held at 1.6 V. Thus, the gate of transistor T1 is at 1.6 V. This high voltage makes transistor T1 much more conductive than transistor T5 so that measured current is due to T5. VSS, VSBA, and external terminal Din are set to 0.0 V. A range of drain voltages for T5 is applied to external terminal VSSA and a range of gate voltages for T5 is applied to VDDWL. At each set of voltages current B (FIG. 9B) is measured into the memory from Din.

To characterize transistor T1 in a forward direction WWL is enabled and 1.6 V is applied to VDD, VNWA, and VDDWL. Thus, the gate of transistor T5 is at 1.6 V. This high voltage makes transistor T5 much more conductive than transistor T1 so that measured current is due to T1. VSS, VSBA, and VSSA are set to 0.0 V. A range of drain voltages for T1 is applied to external terminal Din and a range of gate voltages for T1 is applied to VDDA and external terminal Qout. At each set of voltages current C (FIG. 9C) is measured into the memory from Din.

To characterize transistor T1 in a reverse direction WWL is enabled and 1.6 V is applied to VDD, VNWA, and VDDWL. Thus, the gate of transistor T5 is at 1.6 V. This high voltage makes transistor T5 much more conductive than transistor T1 so that measured current is due to T1. VSS, VSBA, and external terminal Din are set to 0.0 V. A range of drain voltages for T1 is applied to VSSA and a range of gate voltages for T1 is applied to VDDA and external terminal Qout. At each set of voltages current D (FIG. 9D) is measured into the memory from Din.

To characterize transistor T3 in a forward direction WWL is enabled and 1.6 V is applied to VDD and VDDWL. Thus, the gate of transistor T5 is at 1.6 V. This high voltage makes transistor T5 much more conductive than transistor T3 so that measured current is due to T3. VSSA and external terminal Qout are set to 0.0 V. A range of drain voltages for T3 is applied to external terminal Din and a range of source voltages for T3 is applied to VDDA and VNWA. Here, the gate to source voltage of T3 is a difference between 0.0 V and the applied source voltage at VDDA while the drain to source voltage of T3 is a difference between the applied drain voltage at Din and the source voltage at VDDA. At each set of voltages current E (FIG. 9E) is measured into the memory from Din.

To characterize transistor T3 in a reverse direction WWL is enabled and 1.6 V is applied to VDD and VDDWL. Thus, the gate of transistor T5 is at 1.6 V. This high voltage makes transistor T5 much more conductive than transistor T3 so that measured current is due to T3. VSS, VSBA and VDDA are set to 0.0 V. A range of source voltages for T3 is applied to external terminal Din, VNWA, and VSSA. Here, the gate to source voltage of T3 is a difference between the applied source voltage at external terminal Din and the applied gate voltage at external terminal Qout, while the drain to source voltage of T3 is a difference between applied drain voltage at VDDA and the source voltage at external terminal Din. At each set of voltages current F (FIG. 9F) is measured into the memory from Din.

Still further, while numerous examples have thus been provided, one skilled in the art should recognize that various modifications, substitutions, or alterations may be made to the described embodiments while still falling within the inventive scope as defined by the following claims. For example, previously described voltages and test patterns are given by way of example only and are not intended to limit the scope of the claimed invention. Numerous design alternatives, test methods, and test voltages are possible for alternative memory designs such as using 8-transistor or other buffered-read SRAM cells and various processes. Other combinations will be readily apparent to one of ordinary skill in the art having access to the instant specification.

What is claimed is:

1. An integrated circuit, comprising:
    a functional memory having an array of memory cells arranged in rows and columns and operable through row and column peripheral circuitry for write and read operations, each memory cell having a latch portion and a buffer portion;
    a first memory cell of the plurality of memory cells arranged to store a data signal in the latch portion in response to a write signal and also to output the stored data signal to either the latch portion or the buffer portion in response to a read signal, the latch portion coupled between a bit line and a complementary bit line of the first memory cell, the buffer portion directly connected to a read word line and a storage node of the latch portion of the first memory cell; and
    a selection circuit coupled to receive a mode control signal,
    wherein the selection circuit is arranged to receive the data signal from only the buffer portion of the first memory cell in response to a first state of the mode control signal, and
    wherein the selection circuit is arranged to receive the data signal from only the latch portion of the first memory cell in response to a second state of the mode control signal.

2. An integrated circuit as in claim 1, wherein the selection circuit is arranged to receive the data signal in a functional mode.

3. An integrated circuit as in claim 1, wherein the selection circuit is arranged to receive the data signal in a test mode.

4. An integrated circuit as in claim 1, wherein the first memory cell is a static random access memory (SRAM) cell.

5. An integrated circuit as in claim 1, comprising a test circuit operable to test current and voltage characteristics of a plurality of transistors of the first memory cell.

6. An integrated circuit as in claim 5, wherein the current and voltage characteristics determine a threshold voltage of each transistor of the plurality of transistors.

7. An integrated circuit as in claim 5, wherein the current and voltage characteristics determine a leakage current of each transistor of the plurality of transistors.

* * * * *